(12) United States Patent
Bhamidipati et al.

(10) Patent No.: US 10,739,401 B2
(45) Date of Patent: *Aug. 11, 2020

(54) LOGIC BUILT IN SELF TEST CIRCUITRY FOR USE IN AN INTEGRATED CIRCUIT WITH SCAN CHAINS

(71) Applicant: International Business Machines Corporation, Armonk, NY (US)

(72) Inventors: Satya R. S. Bhamidipati, Akividu (IN); Raghu G. Gopalakrishnasetty, Bangalore (IN); Mary P. Kusko, Poughkeepsie, NY (US); Cedric Lichtenau, Boeblingen (DE)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 110 days.

This patent is subject to a terminal disclaimer.

(21) Appl. No.: 16/017,188

(22) Filed: Jun. 25, 2018

(65) Prior Publication Data
US 2018/0306858 A1    Oct. 25, 2018

Related U.S. Application Data

(63) Continuation of application No. 14/987,848, filed on Jan. 5, 2016, now Pat. No. 10,088,524.

(51) Int. Cl.
*G01R 31/28* (2006.01)
*G01R 31/3177* (2006.01)
(Continued)

(52) U.S. Cl.
CPC ..... *G01R 31/3177* (2013.01); *G01R 31/3187* (2013.01); *G01R 31/31727* (2013.01);
(Continued)

(58) Field of Classification Search
CPC ............... G01R 31/3177; G01R 31/28; G01R 31/31727; G01R 31/3187; G06F 11/27; G11C 29/00
See application file for complete search history.

(56) References Cited

U.S. PATENT DOCUMENTS 5,661,732 A    8/1997 Lo et al.
6,115,763 A    9/2000 Douskey et al.
(Continued)

FOREIGN PATENT DOCUMENTS

WO    2011116116 A2    9/2011

OTHER PUBLICATIONS

Huang et al., "Programmable Logic Bist For At-Speed Test," Mentor Graphics Corp., Oct. 2007; 6 pages.
(Continued)

*Primary Examiner* — Albert Decady
*Assistant Examiner* — Enamul M Kabir
(74) *Attorney, Agent, or Firm* — Cantor Colburn LLP; Margaret McNamara (57) ABSTRACT

Aspects include a system having logic built-in self-test (LBIST) circuitry for use in an integrated circuit with scan chains. The system includes a pattern generator configured for generating scan-in test values for said scan chains; a signature register configured for collecting scan-out responses from said scan chains after a clock sequence; an on-product control generator configured for controlling at least one test parameter; one or more microcode array or memory elements configured to receive inputs to initialize fields in the microcode array or memory elements; and a test controller. The test controller includes a reader component configured for reading test parameters from a field of the microcode array or the memory elements; and a programming component configured for configuring the on-product
(Continued)

control generator and the pattern generator with a LBIST pattern according to the read test parameters.

12 Claims, 5 Drawing Sheets

(51) Int. Cl.
    *G01R 31/317* (2006.01)
    *G01R 31/3183* (2006.01)
    *G01R 31/3185* (2006.01)
    *G01R 31/3187* (2006.01)

(52) U.S. Cl.
    CPC ............ *G01R 31/318371* (2013.01); *G01R 31/318547* (2013.01)

(56) References Cited

U.S. PATENT DOCUMENTS

| | | | |
|---|---|---|---|
| 6,553,527 B1 | 4/2003 | Shephard, III | |
| 6,651,202 B1* | 11/2003 | Phan | G01R 31/2891 |
| | | | 714/733 |
| 6,671,838 B1 | 12/2003 | Koprowski et al. | |
| 6,701,476 B2 | 3/2004 | Pouya et al. | |
| 6,886,090 B1 | 4/2005 | Campbell et al. | |
| 6,981,191 B2 | 12/2005 | Dorsey | |
| 7,266,745 B2 | 9/2007 | Kiryu | |
| 7,490,280 B2 | 2/2009 | Grise et al. | |
| 7,519,880 B1 | 4/2009 | Johnson et al. | |
| 7,519,889 B1 | 4/2009 | Cervantes et al. | |
| 7,627,798 B2 | 12/2009 | Kiryu | |
| 7,665,002 B1 | 2/2010 | White et al. | |
| 7,840,865 B2 | 11/2010 | Lai et al. | |
| 7,844,869 B2 | 11/2010 | Bushard et al. | |
| 7,934,134 B2 | 4/2011 | Forlenza et al. | |
| 8,006,153 B2 | 8/2011 | Ferguson et al. | |
| 8,205,124 B2 | 6/2012 | Grise et al. | |
| 8,402,003 B2 | 3/2013 | Biran et al. | |
| 8,423,847 B2 | 4/2013 | Grise et al. | |
| 8,461,865 B2 | 6/2013 | Schlagenhaft | |
| 8,689,066 B2 | 4/2014 | Grady et al. | |
| 8,700,962 B2 | 4/2014 | Tekumalla et al. | |
| 8,799,713 B2 | 8/2014 | Gangasani et al. | |
| 8,883,973 B2 | 11/2014 | Chamberlain et al. | |
| 8,943,377 B2 | 1/2015 | Harper et al. | |
| 9,404,969 B1 | 8/2016 | Keller et al. | |
| 9,448,282 B1 | 9/2016 | Meehl | |
| 9,632,140 B2 | 4/2017 | Kulkarni et al. | |
| 9,797,950 B2 | 10/2017 | Nishikawa | |
| 10,459,031 B2 | 10/2019 | Gloekler et al. | |
| 2002/0083386 A1 | 6/2002 | McCauley et al. | |
| 2002/0125907 A1 | 9/2002 | Kurtulik et al. | |
| 2003/0145263 A1 | 7/2003 | Song et al. | |
| 2004/0230882 A1 | 11/2004 | Huott et al. | |
| 2005/0160339 A1* | 7/2005 | Forlenza | G01R 31/318371 |
| | | | 714/733 |
| 2006/0064265 A1 | 3/2006 | Kiryu | |
| 2007/0266284 A1 | 11/2007 | Chelstrom et al. | |
| 2007/0273401 A1* | 11/2007 | Kiryu | G01R 31/318536 |
| | | | 326/16 |
| 2008/0082887 A1 | 4/2008 | Dhong et al. | |
| 2008/0184024 A1* | 7/2008 | Nicklaus | G06F 9/4401 |
| | | | 713/2 |
| 2008/0276144 A1* | 11/2008 | Huben | G01R 31/318385 |
| | | | 714/733 |
| 2009/0210763 A1 | 8/2009 | Eckelman et al. | |
| 2009/0217116 A1 | 8/2009 | Motika et al. | |
| 2009/0254788 A1 | 10/2009 | Cervantes et al. | |
| 2009/0327824 A1 | 12/2009 | Alaniz et al. | |
| 2010/0115337 A1* | 5/2010 | Forlenza | G01R 31/318544 |
| | | | 714/30 |
| 2010/0262879 A1 | 10/2010 | Floyd et al. | |
| 2011/0231719 A1 | 9/2011 | Kim et al. | |
| 2011/0258499 A1 | 10/2011 | Casarsa | |
| 2012/0189274 A1 | 7/2012 | Toma et al. | |
| 2014/0149814 A1 | 5/2014 | Al-Omari | |
| 2014/0258798 A1 | 9/2014 | Ahmed et al. | |
| 2014/0359386 A1 | 12/2014 | Gorti et al. | |
| 2014/0365840 A1 | 12/2014 | Lin et al. | |
| 2015/0113346 A1 | 4/2015 | Gloekler et al. | |
| 2015/0262706 A1 | 9/2015 | Curley | |
| 2016/0003900 A1 | 1/2016 | Narayanan et al. | |
| 2017/0192054 A1 | 7/2017 | Bhamidipati et al. | |
| 2017/0192055 A1 | 7/2017 | Bhamidipati et al. | |
| 2017/0192057 A1 | 7/2017 | Bhamidipati et al. | |

OTHER PUBLICATIONS

Prabhu et al., "A Diagnosis-Friendly LBIST Architecture With Property Checking," IEEE, International Test Conference, Paper 29.2; Oct. 2014; 9 pages.
Lai et al., "Programmable Scan-Based Logic Built-In Self Test," 16th IEEE Asian Test Symposium, Mentor Graphics Corporation, 2007, 7 pages.
Al-Yamani et al.; "BIST Reseeding With Very Few Seeds"; Proceedings of the 21st IEEE VLSI Test Symposium (2003); 6 pages.
Bushard et al.; "Testing Challenges of a Multicore Microprocessor"; Evaluation Engineering; Feb. 1, 2007; 9 pages <https://www.evaluationengineering.com/testing-challenges-of-a-multicore-microprocessor.php>.
Hakmi et al.; "Programmable Deterministic Built-in Self-test"; IEEE International Test Conference (2007); 9 pages.
Kalligeros et al.; "Multiphase BIST: A New Reseeding Technique for High Test-Data Compression"; IEEE Transactions on Computer-Aided Design of Integrated Circuits and Systems, vol. 23, No. 10; Oct. 2004; 18 pages.
Kiefer et al.; "Using BIST Control for Pattern Generation"; IEEE International Test Conference (1997), Paper 14.3; 9 pages.
List of IBM Patents or Patent Applications Treated as Related; Date Filed: Jun. 25, 2018, 2 pages.

* cited by examiner

LOGIC BUILT IN SELF TEST CIRCUITRY FOR USE IN AN INTEGRATED CIRCUIT WITH SCAN CHAINS

DOMESTIC PRIORITY

This application is a continuation of U.S. application Ser. No. 14/987,848, titled "LOGIC BUILT IN SELF TEST CIRCUITRY FOR USE IN AN INTEGRATED CIRCUIT WITH SCAN CHAINS" filed Jan. 5, 2016, the contents of which are incorporated by reference herein in its entirety.

BACKGROUND

The present invention generally relates to testing integrated circuits and, more specifically, to logic built-in self-test circuitry for use in an integrated circuit with scan chains.

Digital integrated circuits are used for a diverse number of electronic applications, from simple devices such as wristwatches to the most complex computer systems. Defects in digital integrated circuits may occur.

"Stored patterns" was one of the first methods developed for testing digital integrated devices for defects. According to the stored patterns method, a value per latch of the device under test (DUT) is defined, and this data is stored in a chip tester and applied upon pattern execution. Similarly, a clock or capture sequence may be stored. After the functional clock sequence execution, the chip tester receives the measured values per latch and compares them with the expected values to determine defects in the DUT. The stored patterns method requires access of the chip tester to each latch to be tested of the DUT. With millions of latches on a chip this becomes a very time-consuming operation.

Logic built-in self-test (LBIST) has become a popular technique for on-chip testing of digital integrated circuits. LBIST offers a number of benefits targeted at the reduction of test time.

The scannable latches of the DUT may be broken into short scan chains and the major components of LBIST circuitry include a pattern generator, a signature register and an on-product test control generator.

The pattern generator is initialized with a seed and provides scan-in values to the scan chains. A clocking sequence is applied on the DUT and the signature register collects scan-out responses from the scan chains.

The chip tester only needs to store an LBIST setup that includes he seed, the loop count, and the clock sequence. As the scan-in values are generated on the DUT at higher speeds compared to the tester communication speed, the time necessary per loop is significantly reduced.

As technology advances, the number of transistors on a chip increases and the number of defects during manufacturing may increase, in particular when a new manufacturing process is introduced. Moreover, said defects may be difficult to detect. Accordingly, more thorough testing may be required, which consumes more time and augments the test time.

SUMMARY

Embodiments include a method, system, and computer program product for logic built-in self-test circuitry for use in an integrated circuit with scan chains. A system includes a pattern generator configured for generating scan-in test values for said scan chains; a signature register configured for collecting scan-out responses from said scan chains after a clock sequence; an on-product control generator configured for controlling at least one test parameter; one or more microcode array or memory elements configured to receive inputs to initialize fields in the microcode array or memory elements; and a test controller. The test controller includes a reader component configured for reading test parameters from a field of the microcode array or the memory elements; and a programming component configured for configuring the on-product control generator and the pattern generator with a LBIST pattern according to the read test parameters. The test parameters include one or more of number of loops, clock sequence, weight, seed, read/write the on-chip array, variables for the scan itself, and masks/aperture.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Embodiments of the present invention may be better understood, and its numerous objects, features, and advantages made apparent to those skilled in the art by referencing the accompanying drawings.

Figure 1:
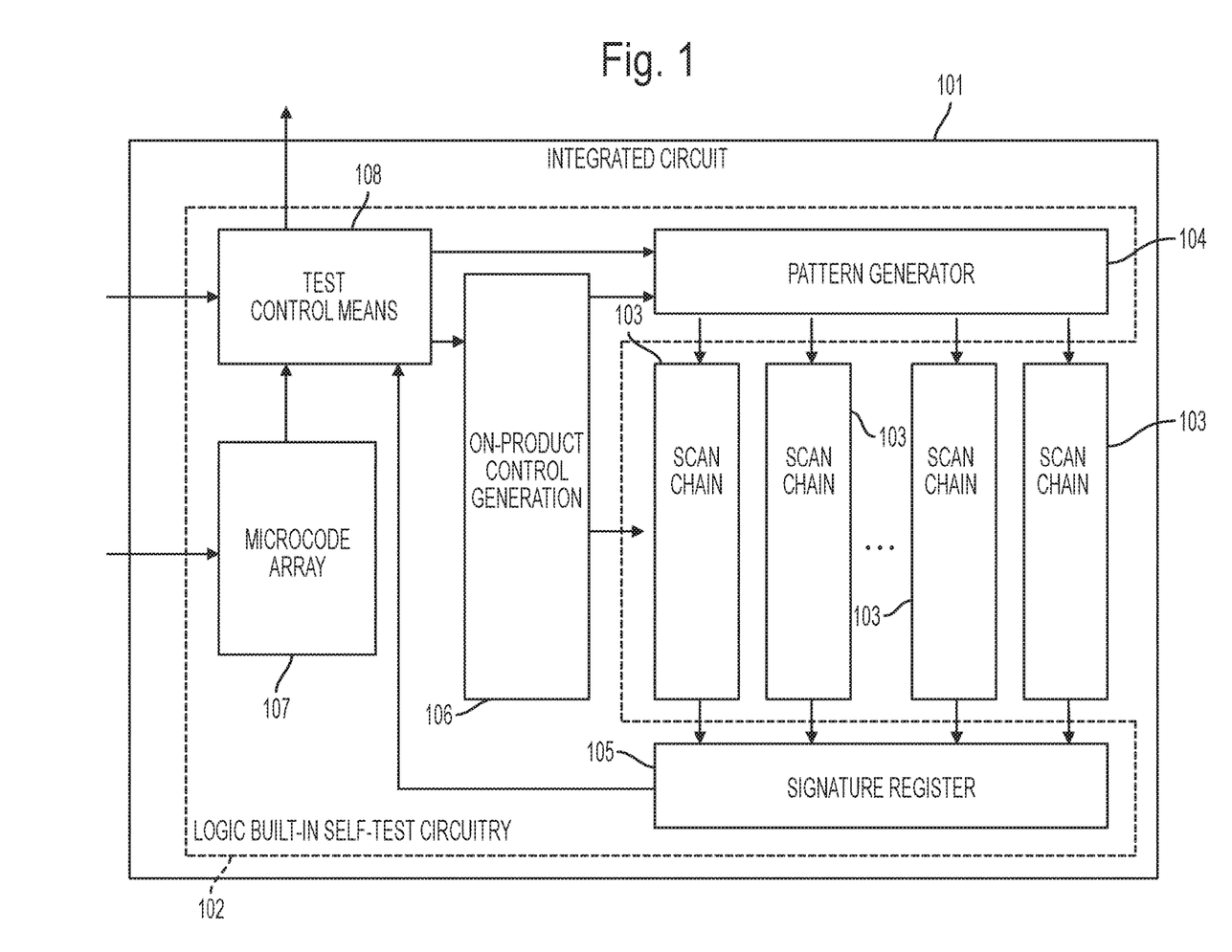
FIG. 1 shows an integrated circuit that includes logic built-in self-test circuitry in accordance with some embodiments of this disclosure.

The embodiment in FIG. 1 discloses an integrated circuit 101 comprising logic built-in self-test circuitry 102 and scan chains 103. The logic built-in self-test circuitry 102 includes a pattern generator 104, a signature register 105 and an on-product control generation 106.

The pattern generator 104 is adapted to generate scan-in values for the scan chains 103 and the multi input register 105 to collect scan-out responses from the scan chains 103. The on-product control generation 106 provides the necessary control for steering the pattern generator 104, the scan chains 103 and the signature register 105 as well as driving the clock sequence to the functional logic.

Moreover, the logic built-in self-test circuitry includes a microcode array 107 with inputs to initialize its fields. Test control means 108 comprise reading means (not shown) to read test parameters from a field of the microcode array 107. Furthermore, the test control means 108 include programming means (not shown) responsive to the reading means to configure the pattern generator 104 and the on-product control generation 106 with the read test parameters.

The test parameters may include but is not limited to a seed, a type of clock sequence, a number of loops, a scan clock rate and a weight.

Typically, the probability that a binary scan-in value generated by the pattern generator is "0" will be 1/2. Applying a weight to the pattern generator may change the probability to 1/8, 7/8, 1/16, 15/16, 1/32, 31/32, 1/64 or 63/64, respectively. This may enhance the chance to detect a defect in the DUT for certain circuits like a large OR or AND gate.

Clocking sequence may include a launch-of clock and/or a launch-of scan. A launch-of clock may be used primarily to detect DC defects. A launch-of scan may be used primarily to detect AC defects. Furthermore, defects may only show up at a specific scan clock rate.

Performing several loops with the same weight, the same type of clock sequence and the same clock rate may increase test coverage at limited additional test time cost.

A set of test parameters to be applied to the DUT, i.e. the pattern generator 104 and the on-product control generation 106, May also be called an LBIST pattern.

From the fields of the microcode array 107 several different LBIST patterns may be derived. The test control means may apply this LBIST patterns on the DUT in the stored sequence or in a random order.

Each design of an integrated circuit may have its particular design for test (DFT) requirements. The disclosed logic built-in self-test circuitry may support executing LBIST patterns with different variations in view of the particular DFT requirements.

The described logic built-in self-test circuitry has to be initialized only once by the chip tester before performing the logic built-in self-test. In particular, only the fields of the microcode array 107 have to be initialized. Thereafter, the different LBIST patterns may be executed automatically. Hence, considerable chip tester time may be saved compared to conventional logic built-in self-test circuitry, where every LBIST pattern has to be initialized separately by the chip tester.

For example, if the DFT requires three different clock sequences and four different weights. The test control means 108 of the logic built-in self-test circuitry would sequence through and execute all twelve combinations and weights with only one initialization of the logic built-in self-test circuitry by initializing the fields of the microcode array. Moreover, only one value from the signature register may be required to determine, whether the logic built-in self-test circuitry passed the test trough all said twelve LBIST patterns or if it failed.

Figure 2:
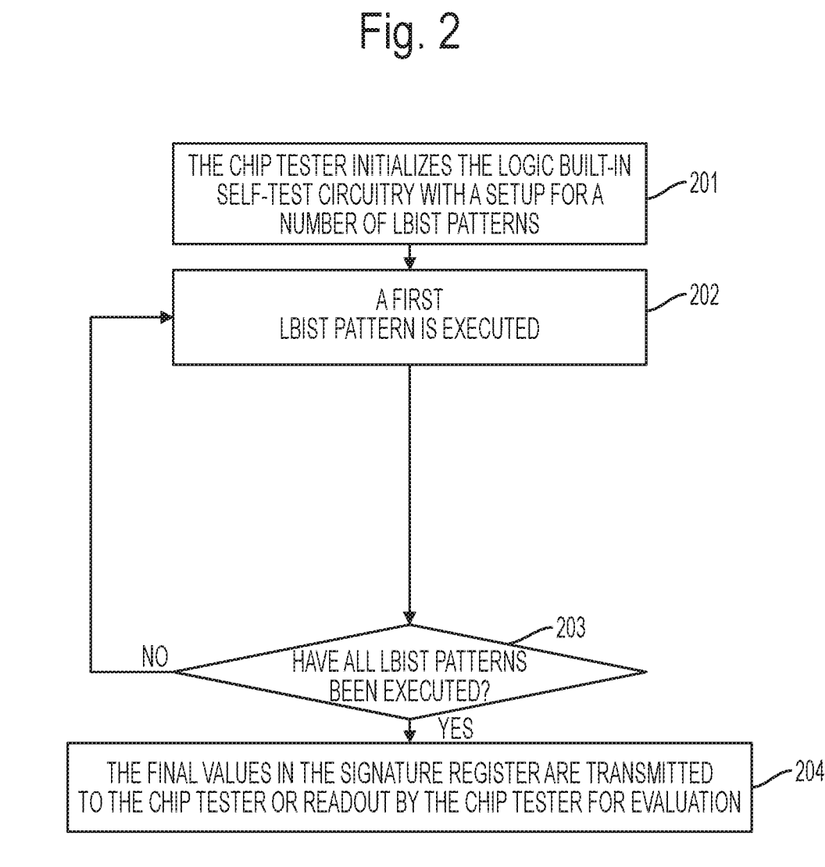
FIG. 2 is a flow chart illustrating a logic built-in self-test method in accordance with some embodiments of this disclosure.

A logic built-in self-test method like shown in FIG. 2 may be described with reference to FIG. 1. In a first step 201, the chip tester initializes the logic built-in self-test circuitry with a setup for a number of LBIST patterns. A first LBIST pattern is executed according to the second step 202. After the execution step 202 it is determined, whether all LBIST patterns have been executed (step 203). If not, the next LBIST pattern is executed pursuant to step 202. After all LBIST patterns have been executed the final values in the signature register are transmitted to the chip tester or readout by the chip tester for evaluation (step 204).

Figure 3:
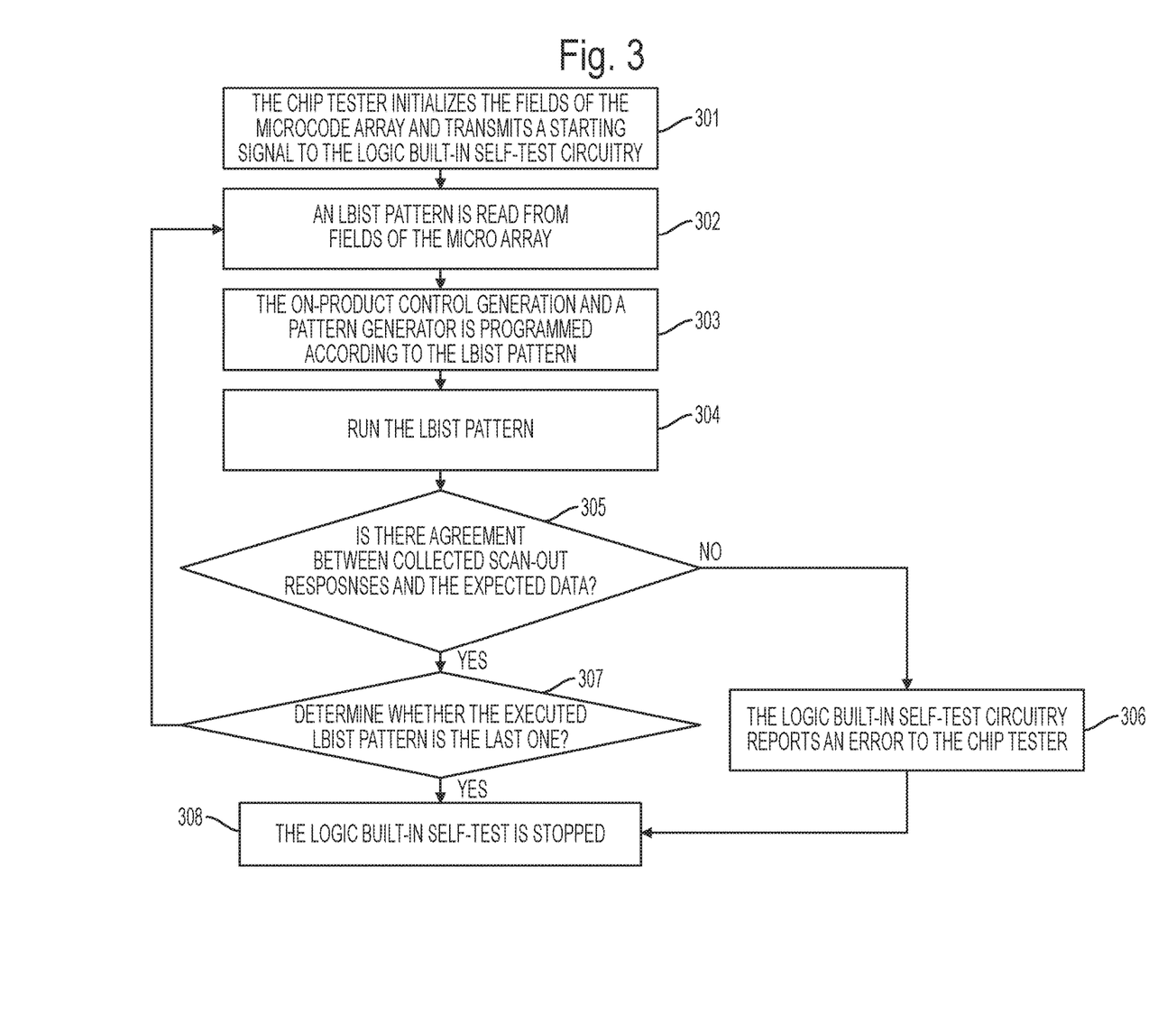
FIG. 3 is a flow chart illustrating another logic built-in self-test method in accordance with some embodiments of this disclosure.

FIG. 3 shows another exemplary logic built-in self-test method. First, the chip tester initializes the fields of the microcode array and transmits a starting signal to the logic built-in self-test circuitry (301). Thereafter, an LBIST pattern is read from fields of the micro array (302) and the on-product control generation and a pattern generator is programmed according to the LBIST pattern (303). After running the LBIST pattern (304), collected scan-out responses from scan chains of the integrated circuit are compared with the expected data (305). If there is no agreement, the logic built-in self-test circuitry reports an error to the chip tester (306) and the logic built-in self-test is stopped (308). In case no error is detected, it is determined whether the executed LBIST pattern has been the last one (307). If true, the logic built-in self-test is stopped (308). If false, the next LBIST pattern is read from fields of the micro array (302).

Figure 4:
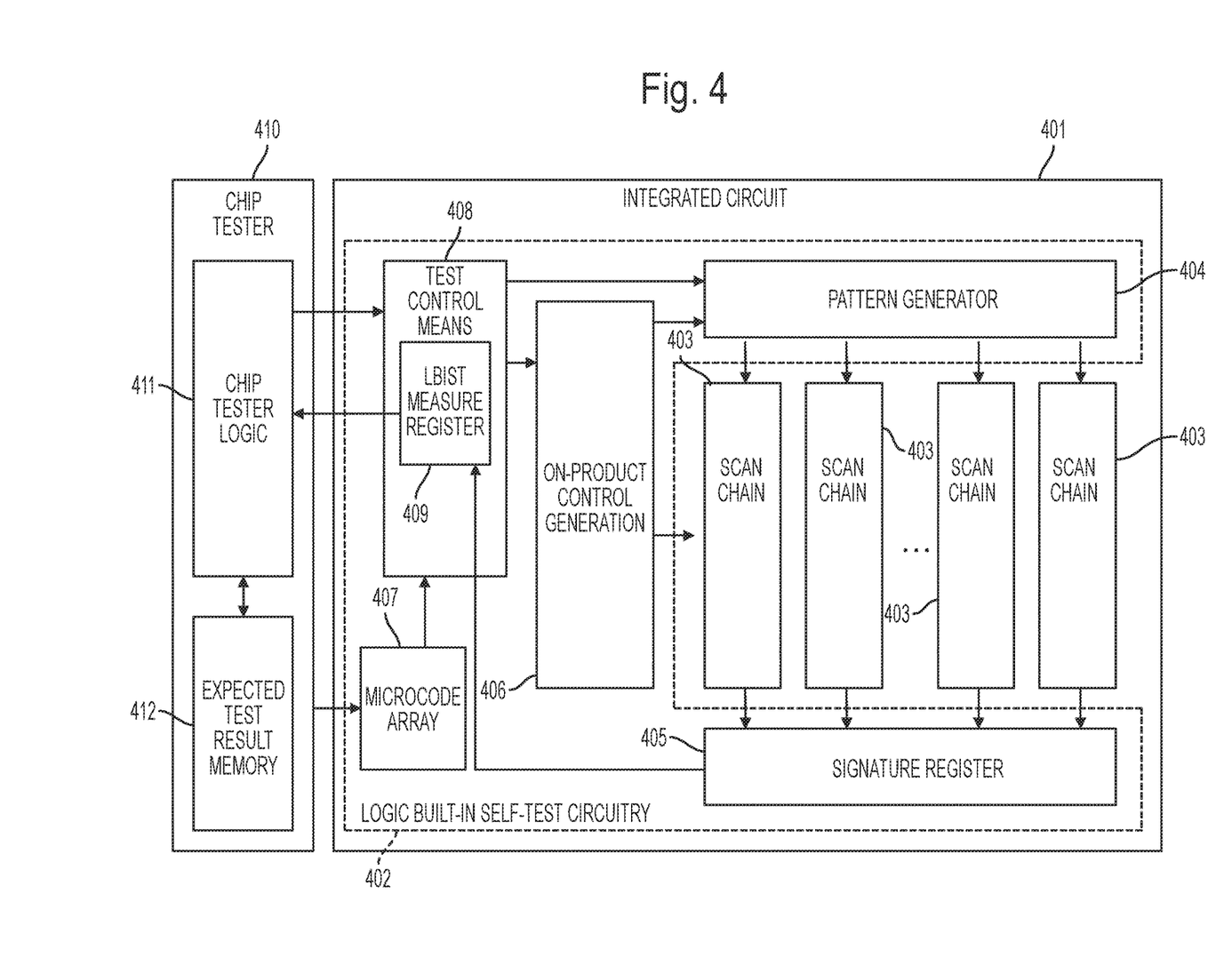
FIG. 4 shows a further integrated circuit comprising logic built-in self-test circuitry and a chip tester in accordance with some embodiments of this disclosure.

FIG. 4 shows another integrated circuit 401 with scan chains 403 and logic built-in self-test circuitry 402. The logic built-in self-test circuitry 402 comprises a pattern generator 404, a signature register 405 and an on-product control generation 406.

The pattern generator 404 may be configured for generating scan-in values for the scan chains 403. The signature register 405 receives the scan-out responses from the scan chains 403. The on-product control generation 406 controls the steering for driving the pattern generator 404, the scan chains 403, and the signature register 405 as well as driving the clock sequence to the functional logic.

Furthermore, the logic built-in self-test circuitry comprises a microcode array 407 including inputs for initializing the fields of the microcode array 407. Additionally, test control means 408 with reading means (not shown) and programming means (not shown) are provided. The reading means are adapted to read test parameters from fields of the microcode array 407 and the programming means are configured to program the pattern generator 404 and the on-product control generation 406 with the read test parameters. The test control means also include an LBIST measure register 409 for temporarily storing the LBIST measure values of the signature register 405 and a flag indicating that an LBIST pattern has been completely executed.

Moreover, a chip tester 410 is depicted in FIG. 4 in schematic form. The chip tester 410 comprises a chip tester logic 411 and an expected test result memory 412. The chip tester logic 411 may be adapted to start the logic built-in self-test of the integrated circuit 401, i.e. the device under test (DUT). The chip tester logic may determine whether the a flag in the LBIST measure register 409 has been set indicating that an LBIST pattern has been completely executed has been set and, depending on the result, to download the LBIST measure values from the LBIST measure register. The downloaded LBIST measure values may then be compared with the expected LBIST values for the specific LBIST pattern, which are stored in the expected test result memory 412.

Figure 5:
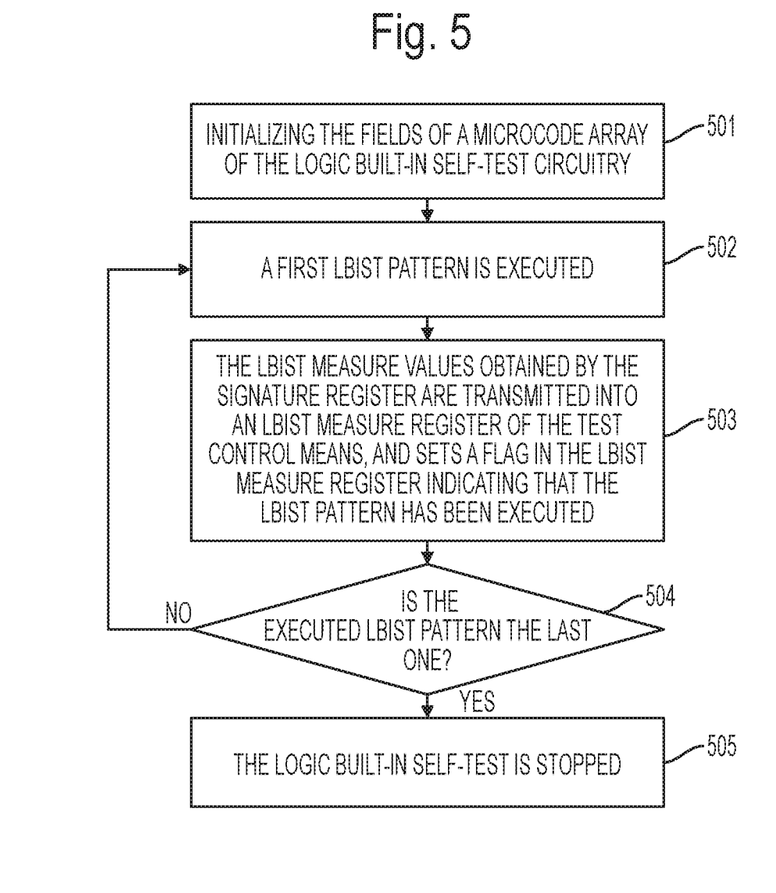
FIG. 5 is a flow chart illustrating an additional logic built-in self-test method in accordance with some embodiments of this disclosure.

A still further logic built-in self-test method may be explained with reference to FIG. 5. As has been described hereinbefore, the method starts with initializing the fields of a microcode array of the logic built-in self-test circuitry (501). Thereafter, a first LBIST pattern is executed (502), the LBIST measure values obtained by the signature register are transmitted into an LBIST measure register of the test control means, and sets a flag in the LBIST measure register indicating that the LBIST pattern has been executed (503). Additionally, information indicative of the applied LBIST pattern (number of clocks, type of clock sequence, weight) may be stored in the LBIST measure register. If it is determined in step 504 that the executed LBIST pattern was the last one, the logic built-in self-test is stopped (505). Otherwise, the steps 502 to 504 are repeated.

According to a first aspect, the invention relates to logic built-in self-test circuitry for use in an integrated circuit with scan chains, comprising (but not limited to) a pattern generator for generating scan-in test values for said scan chains; a signature register for collecting scan-out responses from said scan chains after a clock sequence; an on-product control generation to control at least one test parameter; a microcode array or memory element with inputs to initialize its fields; test control means comprising: reading means to read test parameters from a field of said microcode array, wherein the test parameters include at least one of a type of clock sequence, a number of loops and a weight; programming means responsive to said reading means to configure said on-product control generation and said pattern generator with an LBIST pattern according to the read test parameters. According to a second aspect, the invention relates to a logic built-in self-test method comprising: initializing fields of a microcode array; reading test parameters from a field of the microcode array, wherein the test parameters include at least one of a type of clock sequence, a number of loops, a weight; programming a product control generation and a pattern generator with an LBIST pattern according to the read test parameters; generating scan-in values for scan chains with the pattern generator; controlling at least one test parameter with the product control generation; collecting scan-out responses from the scan chains in a signature register.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The invention claimed is:

1. A system comprising logic built-in self-test (LBIST) circuitry for use in an integrated circuit with scan chains, the system comprising:
   a pattern generator configured for generating scan-in test values for said scan chains;
   a signature register configured for collecting scan-out responses from said scan chains after a clock sequence;
   an on-product control generator configured for controlling at least one test parameter;
   a communication component configured for communicating with a chip tester; and
   a microcode array configured to receive multiple sets of test parameters to initialize the microcode array with a setup for a plurality of LBIST patterns, wherein initializing includes initializing, by the chip tester, fields of the microcode array with the multiple sets of test parameters, wherein each set of test parameters of the multiple sets of test parameters is associated with a different LBIST pattern of the plurality of LBIST patterns, and wherein the microcode array is initialized by the chip tester only once before the plurality of LBIST patterns are executed.

2. The system of claim 1 further comprising:
   a test controller comprising a reader component configured for reading test parameters associated with a first LIBIST pattern of the plurality of LBIST patterns from a field of the microcode array, wherein the test controller is configured to repeatedly read test parameters associated with other LIBST patterns of the plurality of LBIST patterns from fields of the microcode array via the reader and to configure the on-product control generator and the pattern generator with the other LBIST patterns according to the read test parameters sequentially.

3. The system of claim 1 further comprising:
   a test controller comprising a reader component configured for reading test parameters associated with a first LIBIST pattern of the plurality of LBIST patterns from a field of the microcode array, wherein the test controller is configured to repeatedly read test parameters associated with other LIBST patterns of the plurality of LBIST patterns from fields of the microcode array via the reader and to configure the on-product control generator and the pattern generator with the other LBIST patterns according to the read test parameters randomly.

4. The system of claim 1, wherein the communication component for communicating with the chip tester includes:
   a receiver configured for receiving a start request from the chip tester;
   a starter configured for, responsive to the receiver receiving the start request, triggering the test controller; and
   reporting component configured for, responsive to the triggering the test controller, communicating test summary data to the chip tester.

5. A method for logic built-in self-testing (LBIST), the method comprising:
   receiving multiple sets of test parameters at a microcode array of a system to initialize the array with a setup for a plurality of LBIST patterns, wherein the initializing includes initializing, by a chip tester, fields of the microcode array with multiple sets of test parameters, wherein each set of test parameters of the multiple sets of test parameters is associated with a different LBIST pattern of the plurality of LBIST patterns, and wherein the microcode array is initialized by the chip tester only once before executing the plurality of LBIST patterns; and wherein the system includes an on-product control generator configured for controlling at least one test parameter and a communication component configured for communicating with the chip tester.

6. The method of claim 5, further comprising:

reading test parameters associated with a first LBIST pattern of the plurality of LBIST patterns from a field of the microcode array; and repeatedly reading test parameters associated with other LIBST patterns of the plurality of LBIST patterns from fields of the microcode array and programming the on-product control generator and a pattern generator with the other LBIST patterns in sequential order.

7. The method of claim 5, further comprising:

reading test parameters associated with a first LBIST pattern of the plurality of LBIST patterns from a field of the microcode array; and repeatedly reading test parameters associated with other LIBST patterns of the plurality of LBIST patterns from fields of the microcode array and programming the on-product control generator and a pattern generator with the other LBIST patterns in random order.

8. The method of claim 5, further comprising:

receiving a start request from the chip tester;

responsive to receiving the start request, triggering a test controller; and responsive to the triggering, communicating test summary data to the chip tester.

9. A computer program product for logic built-in self-testing (LBIST), computer program product comprising a non-transitory computer readable storage medium having program instructions embodied therewith, the program instructions executable by a processor to cause the processor to perform:

receiving multiple sets of test parameters at a microcode array of a system to initialize the array with a setup for a plurality of LBIST patterns, wherein the initializing includes initializing, by a chip tester, fields of the microcode array with multiple sets of test parameters, wherein each set of test parameters of the multiple sets of test parameters is associated with a different LBIST pattern of the plurality of LBIST patterns, and wherein the microcode array is initialized by the chip tester only once before executing the plurality of LBIST patterns; and wherein the system includes an on-product control generator configured for controlling at least one test parameter and a communication component configured for communicating with the chip tester.

10. The computer program product of claim 9, wherein the program instructions further cause the processor to perform:

reading test parameters associated with a first LBIST pattern of the plurality of LBIST patterns from a field of the microcode array; and repeatedly reading test parameters associated with other LIBST patterns of the plurality of LBIST patterns from fields of the microcode array and programming the on-product control generator and a pattern generator with the other LBIST patterns in sequential order.

11. The computer program product of claim 9, wherein the program instructions further cause the processor to perform:

reading test parameters associated with a first LBIST pattern of the plurality of LBIST patterns from a field of the microcode array; and repeatedly reading test parameters associated with other LIBST patterns of the plurality of LBIST patterns from fields of the microcode array and programming the on-product control generator and a pattern generator with the other LBIST patterns in random order.

12. The computer program product of claim 9, wherein the program instructions further cause the processor to perform:

receiving a start request from the chip tester;

responsive to receiving the start request, triggering a test controller; and responsive to the triggering, communicating test summary data to the chip tester.

\* \* \* \* \*